United States Patent
Gillespie et al.

(10) Patent No.: US 7,274,231 B1
(45) Date of Patent: Sep. 25, 2007

(54) LOW JITTER FREQUENCY SYNTHESIZER

(75) Inventors: Timothy Gillespie, Beverly Hills (AU); William G. Baker, North Parramatta (AU)

(73) Assignee: Integrated Device Technology, Inc., San Jose, CA (US)

(*) Notice: Subject to any disclaimer, the term of this patent is extended or adjusted under 35 U.S.C. 154(b) by 0 days.

(21) Appl. No.: 11/229,472

(22) Filed: Sep. 15, 2005

(51) Int. Cl.
  *H03L 7/06* (2006.01)
(52) U.S. Cl. ................... 327/158; 327/156
(58) Field of Classification Search .......... 327/105, 327/113, 156–158, 147–149, 551
See application file for complete search history.

(56) References Cited

U.S. PATENT DOCUMENTS

| | | |
|---|---|---|
| 4,609,881 A | 9/1986 | Wells |
| 4,965,531 A | 10/1990 | Riley |
| 4,965,533 A | 10/1990 | Gilmore |
| 5,818,303 A | 10/1998 | Oishi et al. |
| 6,359,950 B2 * | 3/2002 | Gossmann et al. ......... 375/376 |
| 6,603,360 B2 | 8/2003 | Kim et al. |
| 6,690,215 B2 | 2/2004 | McCune, Jr. et al. |
| 6,693,468 B2 | 2/2004 | Humphreys et al. |
| 6,788,232 B1 | 9/2004 | Lee |
| 6,826,247 B1 | 11/2004 | Elliott |
| 6,873,213 B2 | 3/2005 | Tsuda et al. |

* cited by examiner

*Primary Examiner*—Dinh T. Le
(74) *Attorney, Agent, or Firm*—Glass & Associates

(57) ABSTRACT

A frequency synthesizer IC is disclosed that includes a variable delay circuit, a fractional-N phase locked loop circuit, and a feedback loop. The variable delay circuit is electrically coupled to the input of the fractional-N phase locked loop circuit. The feedback loop couples a first control signal from the fractional-N phase locked loop to the variable delay circuit. The variable delay circuit generates a reference signal that has a phase delay that varies in accordance with a second control signal and a first control signal. The fractional-N phase locked loop circuit is operable upon receiving the reference signal to generate the first control signal, the second control signal, and an output signal having a frequency that is a non-integer product of the reference signal.

22 Claims, 5 Drawing Sheets

LOW JITTER FREQUENCY SYNTHESIZER

FIELD OF THE INVENTION

The present invention relates generally to the field of phase locked loop (PLL) circuits. More specifically, the present invention relates to fractional-N frequency synthesizers.

BACKGROUND ART

Phase locked loop-(PLL) based frequency synthesizers are widely used in communication applications such as wireless communication, Bluetooth, wireless local area network (WLAN), Wideband Code-Division and Multiple Access (WCDMA). PLL-based frequency synthesizers (frequency synthesizers) operate to lock on to an incoming reference signal in order to generate an output signal having a frequency that is related to that of the incoming reference signal. PLL-based frequency synthesizer typically uses frequency divider circuits to generate output frequencies that can be expressed as the product between the frequency of the incoming reference signal and the ratio of two integers N and M, e.g., $f_{OUT}=(N/M)*f_{REF}$. The direct multiplication technique used in this type of frequency synthesizers requires tradeoff between the ratio of N and M and the noise performance of the frequency synthesizer. Increasing the values of N and M to achieve fine frequency resolution worsens the phase jitter performance in the output signal by a factor of the logarithm of N and M. In addition, increasing the values of N and M by adding more bits causes power dissipation and increased die size.

To overcome the above problems caused by integer multiplication in frequency synthesizers, fractional-N frequency synthesizers can be used. In fractional-N frequency synthesizers, a non-integer number is used to multiply the frequency of the incoming reference signal. The time average of the target non-integer number is achieved by dividing the frequency of the reference signal by N or by N+1 alternatively. For example, fractional-N frequency synthesizer divided by 19.1 consists of N-divider dividing nineteen 90% of the time, and by twenty 10% of the time. However, fractional-N frequency synthesizers introduce jitter noise in the output signal due to the phase error accumulated in each cycle.

To improve jitter noise in fractional-N frequency synthesizers, a sigma delta modulator can be used to shape the noise imported by the average division method. However, the heavy digital activity of the sigma delta modulator, which provides the averaging function, creates spurious components at the output. In particular, by using the average division of sigma delta modulators, the average division is correct, but the instantaneous division is incorrect. Because of this, the phase frequency detector and charge pump are constantly trying to correct for instantaneous phase errors. In addition, an overflow from the sigma delta modulator creates a resulting phase step at the phase frequency detector that cannot be filtered by the loop low pass filter. This phase step causes jitter at the output signal. In addition, the digital noise, combined with inaccuracies in matching the hardworking charge pump, results in spurious levels greater than those allowable by many communications standards.

In one prior art method, a variable delay is added in the feedback loop of the frequency synthesizers to remove the resulting phase step at the phase frequency detector. This method reduces this type of jitter at the output of the frequency synthesizer. However, this type of frequency synthesizer has "dead zone" problems that result from the small amount of phase error that cannot be detected by the phase frequency detector. This causes large jitter and phase noise in the output signal. In addition, adding a phase delay in the feedback loop of a PLL-based frequency synthesizer adds complexity in the system that adversely affects the size and noise performance the frequency synthesizer.

Thus, there is a need for a high speed PLL-based frequency synthesizer that can produce an output frequency that is a fractional multiplication of the input frequency that has good jitter noise performance. Furthermore, there is a need for a low jitter frequency synthesizer that has good jitter noise performance. The present invention meets the above needs.

SUMMARY OF THE INVENTION

The present invention provides a frequency synthesizer that includes a variable delay circuit, a fractional-N phase locked loop circuit, and a feedback loop. The variable delay circuit in the input path of the fractional-N phase locked loop circuit anticipates and removes the phase error at the phase frequency detector in each cycle, thus solving the dead zone problem and the phase step problem of prior art phase locked loop circuits.

The variable delay circuit is added in the input path of the low jitter frequency synthesizer. The feedback loop couples the first control signal from the fractional-N phase locked loop circuit to the variable delay circuit. Upon receipt of an input signal, a first control signal, and a second control signal, the variable delay circuit is operable to provide phase adjustments to the input signal to generate a reference signal. The phase adjustments vary in dependence on the second control signal and the first control signal. The reference signal is input to a fractional-N phase locked loop circuit. Upon receipt of the reference signal, the fractional-N phase locked loop circuit is operable to generate an output signal of the input signal.

A method of achieving low jitter output signal in fractional-N frequency synthesis is disclosed that includes receiving an input signal, receiving a first control signal and a second control signal from a fractional-N phase locked loop circuit, providing phase adjustments to the input signal to generate a reference having a frequency that is a non-integer product signal, inputting the reference signal into the fractional-N phase locked loop circuit, and generating an output signal. The phase adjustments to the input signal vary in dependence on the second control signal and the first control signal.

These and other advantages of the present invention will no doubt become obvious to those of ordinary skill in the art after having read the following detailed description of the preferred embodiments, which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
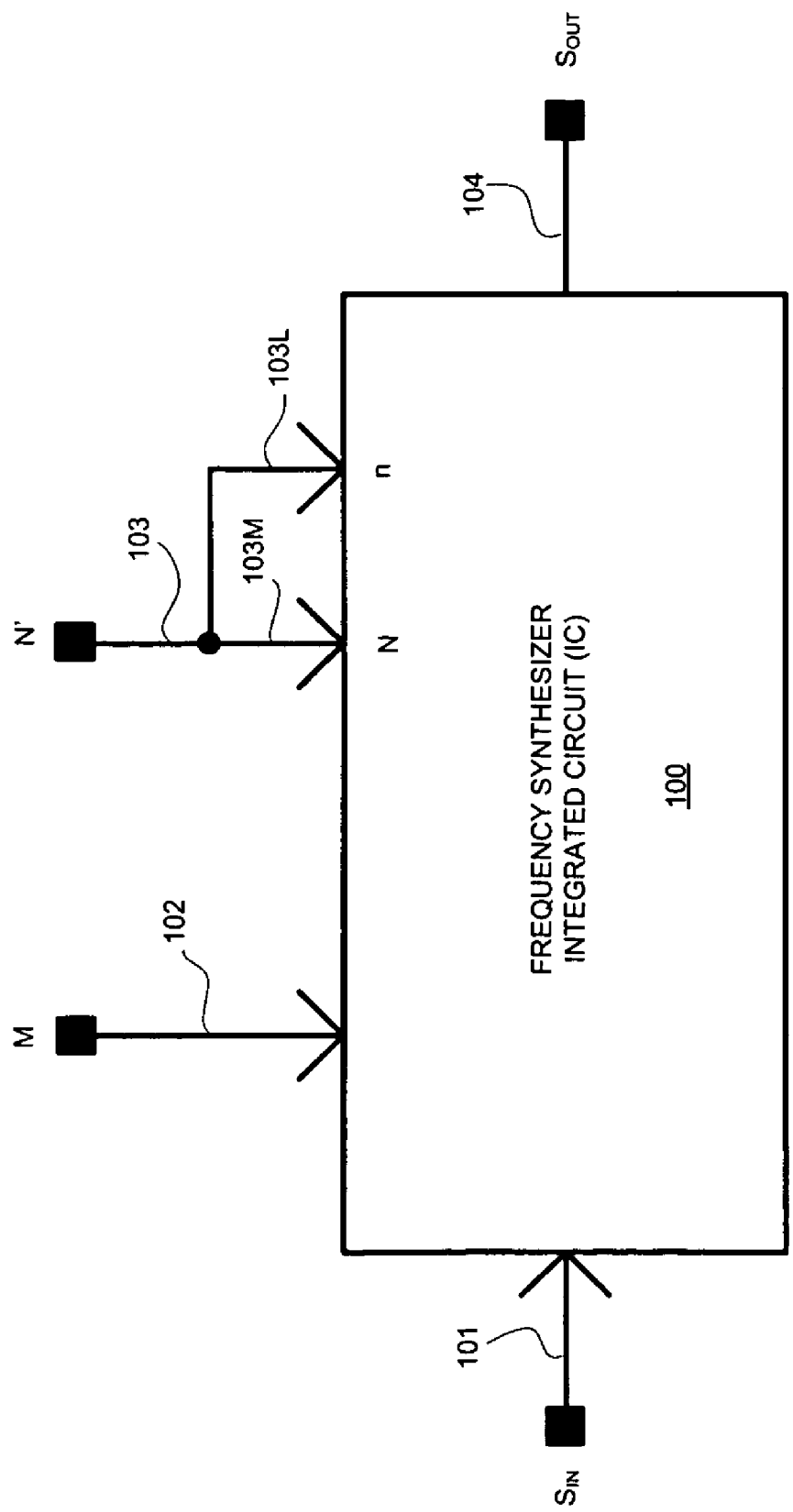
FIG. 1 illustrates a frequency synthesizer integrated circuit (IC) that includes input signal ($S_{IN}$) terminal, an integer (M) input terminal, a non-integer (N') input terminal and an output signal ($S_{OUT}$) terminal in accordance with one embodiment of the present invention.

Referring to FIG. 1, a frequency synthesizer integrated circuit (IC) 100 is shown that includes an input terminal 101, an integer input terminal 102, a non-integer input terminal 103, and an output terminal 104. It is understood that frequency synthesizer integrated circuit 100 can also include other terminals such as supply power terminals, application terminals, controller terminals, etc. In the present embodiment, frequency synthesizer integrated circuit 100 includes a single semiconductor chip that is packaged using Surface Mount Device (SMD) technology or a Very thin profile Quad Flat Non-leaded package (VQFN). Alternatively, other types of packages could be used and the present invention is intended to include all such packages. Input terminal 101 receives an input signal $S_{IN}$ having an input frequency ($f_{IN}$). Integer input terminal 102 receives an integer number M. The ratio of input frequency ($f_{IN}$) and integer number M indicates the step size of frequency synthesizer IC 100. Non-integer input terminal 103 receives a non-integer number N' that further includes an integer portion N and fraction portion n. Non-integer input terminal 103 includes an integer terminal 103M and a fraction terminal 103L. Integer terminal 103M receives the integer portion N of non-integer number N' whereas fraction terminal 103L receives fraction portion n of non-integer number N'. For example, if non-integer number N' is 5.2 then integer portion N equals to 5 and fraction portion n equals to 0.2. In one embodiment of the present invention, integer number M and non-integer number N' are digital numbers represented by a sequence of 0's and 1's. Integer terminal 103M receives the most significant bit (MSB) of non-integer number N'. Fraction terminal 103L receives the least significant bit (LSB) of non-integer number N'. For example, if N' is 5.2, N' can be represented in digital number as 00000101.001100110011 then integer terminal 103M receives 00000101 (or 5) and fractional terminal 103L would receive 0.001100110011 (or approximately 0.2).

In operation, frequency synthesizer IC 100 receives input signal $S_{IN}$ having input frequency ($f_{IN}$) at input terminal 101, integer number M at integer input terminal 102, and non-integer number N' at non-integer input terminal 103. The values of M and N' can be changed by users via integer input terminal 102 and non-integer input terminal 103 respectively. Frequency synthesizer IC 100 produces an output signal $S_{OUT}$ at output terminal 104. Output signal $S_{OUT}$ has an output frequency ($f_{OUT}$) equal to the product of the input frequency ($f_{IN}$) and non-integer number N' divided by integer number M, e.g., $f_{OUT}=(f_{IN}*N')/M$. For example, if M equals to 5 and N' equals to 5.2, input frequency ($f_{IN}$) is 10 MHz, then output frequency is 10.4 MHz ($f_{OUT}=(10$ MHz*5.2)/5=10.4 MHz). Next if M equals 5 and N' equals 5.4 then output frequency is 10.8 MHz ($f_{OUT}=10.8$ MHz).

In the present embodiment, frequency synthesizer IC 100 includes a variable delay circuit electrically connected to the input of a fractional-N phase locked loop circuit and a feedback loop electrically connected to the fractional-N phase locked loop circuit to supply a first control signal to the variable delay circuit. The first control signal couples the output frequency ($f_{OUT}$) to the variable delay circuit and indicates the unit time delay or the time delay per clock cycle ($T_C$) of a comparison signal $C_K(t)$. The amount of time delay per clock cycle depends on the period ($T_O$) of the output signal ($S_{OUT}$). The variable delay circuit receives a divided input signal ($S_{DIVIN}$) and a second control signal to produce a reference signal ($S_{REF}$). The divided input signal ($S_{DIVIN}$) has a frequency ($f_{DIVIN}$) equal to input frequency ($f_{IN}$) divided by integer number M ($f_{DIVIN}=f_{IN}/M$). The second control signal is supplied by the fractional-N phase locked loop circuit to the variable delay circuit to provide an amount of phase adjustments to the divided input signal.

The reference signal $S_{REF}$ having a reference frequency ($f_{REF}$) is input to the fractional-N phase locked loop circuit. Upon receipt of the reference signal, the fractional-N phase locked loop circuit performs fractional-N frequency synthesis to produce a comparison signal $C_K(t)$. The comparison signal $C_K(t)$ has a frequency ($f_{COM}$) that is a fraction of the output frequency ($f_{OUT}$). The output frequency is the product of the reference frequency ($f_{REF}$) and non-integer number N', $f_{OUT}=f_{COM}*N'$ (or $f_{COM}=f_{OUT}/N'$). The fractional-N phase locked loop circuit locks the comparison signal $C_K(t)$ to the reference signal $S_{REF}$ to generate the output frequency ($f_{OUT}$). Since comparison signal $C_K(t)$ is locked into reference signal $S_{REF}$, the frequency of comparison signal $C_K(t)$ equal to that of the reference signal, $f_{COM}=f_{REF}$ ($f_{OUT}/N'=f_{IN}/M$). Thus, fractional-N phase locked loop circuit generates the output frequency ($f_{OUT}$) that is a non-integer product of the input frequency ($f_{IN}$), $f_{OUT}=(f_{IN}*N')/M$.

Continuing with FIG. 1, since the variable delay circuit of the frequency synthesizer IC 100 anticipates and removes phase error in the input signal, the fractional-N phase locked loop circuit performs the fractional synthesis on the input signal with phase adjustments (reference signal). The phase frequency detector and the charge pump of the frequency synthesizer IC 100 do not have to correct instantaneous phase errors. As a result, the short-term phase error is zero, thus output signal is produced with low jitter noise.

Figure 2:
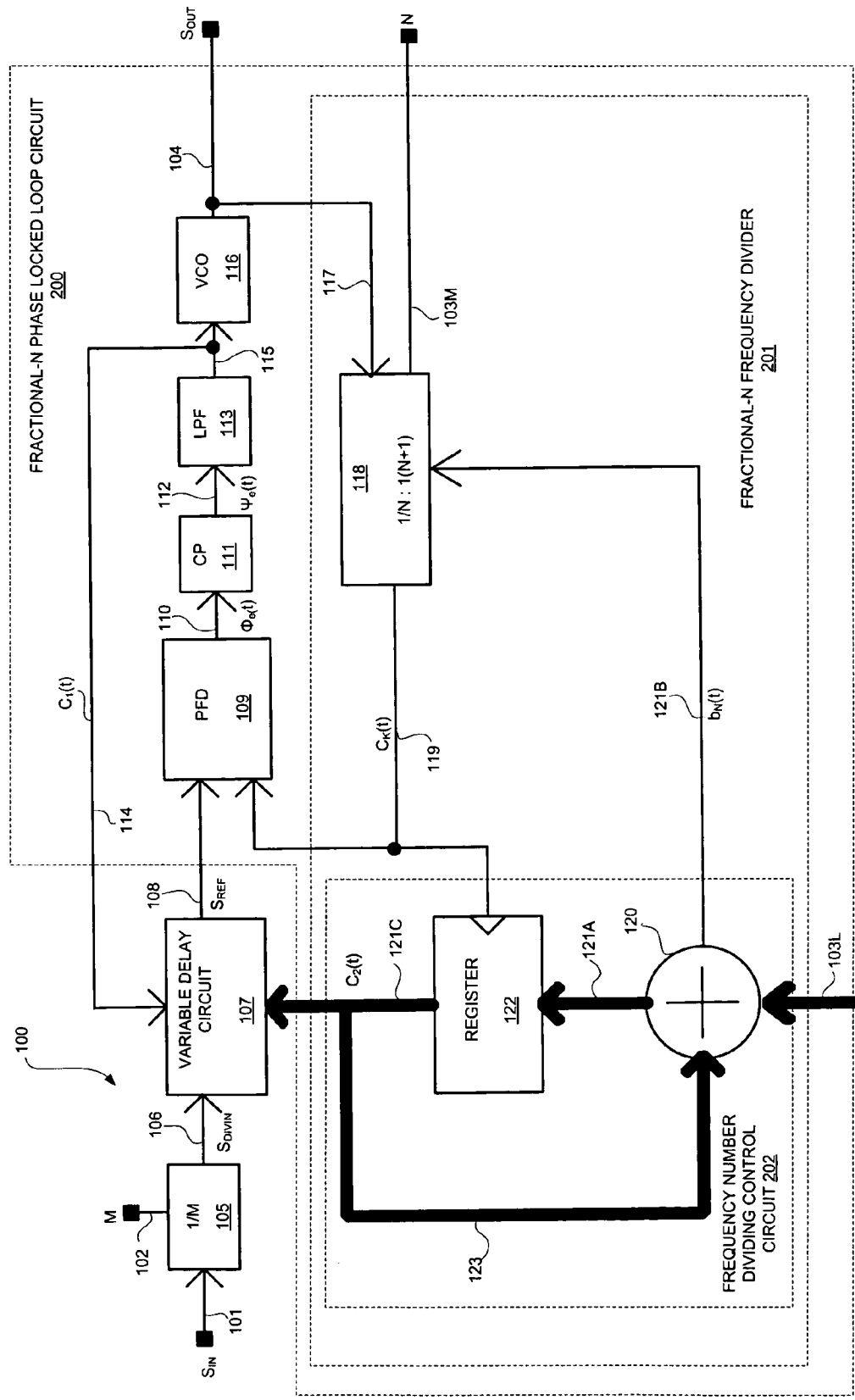
FIG. 2 illustrates a schematic diagram of a frequency synthesizer IC of FIG. 1 that includes a variable delay circuit electrically coupled to the input path of a fractional-N phase locked loop circuit and a feedback loop that supplies a control signal to the variable delay circuit in accordance with an embodiment of the present invention.

In the embodiment shown in FIG. 2, frequency synthesizer IC 100 includes a variable delay circuit 107 coupled to an input path 108 of a fractional-N phase locked loop (PLL) circuit 200 and a feedback loop 114. Feedback loop 114 is electrically connected to fractional-N phase locked loop 200 and supplies a first control signal $C_1(t)$ to variable delay circuit 107. An input path 108 provides input to fractional-N phase locked loop circuit 200. Fractional-N phase locked loop circuit 200 includes a phase frequency detector 109, a charge pump circuit 111, a loop filter 113, and a voltage controlled oscillator (VCO) 116. The output of voltage controlled oscillator (VCO) 116 provides output signal $S_{OUT}$ Of frequency synthesizer IC 100 via output terminal 104.

Frequency synthesizer 100 further includes an input frequency divider 105 that is electrically connected to input terminal 101 to receive input signal $S_{IN}$ having input frequency ($f_{IN}$). Input frequency divider 105 is also electrically connected to integer input terminal 102 to receive integer number M. Input frequency divider 105 produces a divided input signal $S_{DIVIN}$ via signal path 106. Divided input signal $S_{DIVIN}$ has a frequency ($f_{DIVIN}$) equal to input frequency ($f_{IN}$) divided by integer number M ($f_{DIVIN}=f_{IN}/M$). The input of variable delay circuit 107 is electrically connected to the output $S_{DIVIN}$ of input frequency divider 105 via signal path 106. The output of variable delay circuit 107 (reference signal $S_{REF}$) is electrically connected to fractional-N phase locked loop circuit 200 at input path 108 that is electrically connected to phase frequency detector 109. More particularly, phase frequency detector 109 receives reference signal $S_{REF}$ via input path 108. The output of phase frequency detector 109 is electrically connected to charge pump circuit 111 via signal path 110. Charge pump circuit 111 is electrically connected to loop filter 113 via signal path 112. The output of loop filter 113 is first control signal $C_1(t)$. First control signal $C_1(t)$ is electrically fed back to variable delay circuit 107 via feedback loop 114 that electrically connects the output of loop filter 113 to variable delay circuit 107. First control signal $C_1(t)$ is also electrically connected to voltage control oscillator (VCO) via signal path 115. The output of voltage controlled oscillator (VCO) 116 is electrically connected to output signal $S_{OUT}$ via output terminal 104 and to a fractional-N frequency divider 201 via signal path 117.

Continuing with FIG. 2, a fractional-N frequency divider 201 forms a feedback loop for fractional-N phase locked loop circuit 200. Fractional-N frequency divider 201 includes a N/(N+1) frequency divider 118 that is electrically connected to a frequency number dividing control circuit 202. N/(N+1) frequency divider 118 receives integer portion N via integer terminal 103M, output signal $S_{OUT}$ via signal path 117, and a frequency control number $b_N(t)$ via signal path 121B to produce a comparison signal $C_K(t)$. Comparison signal $C_K(t)$ is fed to a second input of phase frequency detector 109 via a signal path 119. Fractional-N frequency divider 201 includes a N/(N+1) frequency divider 118 that is controlled by frequency number dividing control circuit 202. N/(N+1) frequency divider 118 has a control input and is operable to vary its division ratio in dependence on an overflow signal $b_N(t)$ applied to such control input via signal path 121B. For any non-integer number N' that can be represented as N'=N+K/L, overflow signal $b_N(t)$ has a logic LOW for (L−K) out of L cycles of clock $C_K(t)$. N/(N+1) frequency divider 118 divides the output frequency ($f_{OUT}$) by N for (L−K) clock cycles. Otherwise, overflow signal $b_N(t)$ has a logic HIGH for K out of L clock cycles, N/(N+1) frequency divider 118 divides the output frequency ($f_{OUT}$) by N+1 for K clock cycles.

Frequency number dividing control circuit 202 is a sigma delta modulator which further includes an adder 120 electrically connected to a register 122. Adder 120 is electrically connected to fraction terminal 103L to receive fraction portion n of non-integer number N'. Adder 120 is a modulo-L adder that provides an overflow signal $b_N(t)$ to N/(N+1) frequency divider 118 via signal path 121B. The output of adder 120 is electrically connected to register 122 via a signal path 121A. Register 122 is clocked by comparison signal $C_K(t)$ via signal path 119 and is electrically connected to variable delay circuit 107 via signal path 121C. At each rising edge of comparison signal $C_K(t)$, register 122 samples its input 121A, and outputs its content out to variable delay circuit 107 via signal path 121C. The output of register 122 is second control signal $C_2(t)$ which is also fed back to adder 120 via signal path 123.

In operation, frequency synthesizer 100 receives input signal $S_{IN}$ at input terminal 101. Input frequency divider 105 divides the frequency ($f_{IN}$) of input signal $S_{IN}$ to produce divided input signal $S_{DIVIN}$ at signal terminal 106, $f_{DIVIN}=f_{IN}/M$. Variable delay circuit 107 receives divided input signal $S_{DIVIN}$ via signal path 106 and provides phase adjustments to divided input signal $S_{DIVIN}$ to produce reference signal $S_{REF}$. The amount of phase adjustments provided to divided input signal $S_{DIVIN}$ is determined by second control signal $C_2(t)$. The amount of time delay per clock cycle for a given phase adjustment is determined by first control signal $C_1(t)$ and second control signal $C_2(t)$. Reference signal $S_{REF}$ is fed to fractional-N phase locked loop circuit 200 via input path 108. Fractional-N phase locked loop 200 produces output signal $S_{OUT}$ at output terminal 104 by using fractional-N division method. Output signal $S_{OUT}$ has output frequency ($f_{OUT}$) equal to the comparison frequency ($f_{COM}$) multiplied by non-integer number (N'), e.g., $f_{OUT}=N'*f_{COM}$. Fractional-N phase locked loop circuit 200 locks comparison signal $C_K(t)$ to reference signal $S_{REF}$. These two signals now having the same frequency, $f_{COM}=f_{REF}$. In one embodiment of the present invention, input frequency divider 105 can be set to divide the frequency ($f_{IN}$) of input signal $S_{IN}$ by 1 (e.g., integer number M at integer terminal 102 is set to 1 (M=1)). In this situation, the output of variable delay circuit 107 has a frequency that is equal to the input frequency ($f_{IN}$) ($f_{REF}=f_{IN}$).

When frequency synthesizer 100 is in the locked condition, first control signal $C_1(t)$ from the output of loop filter 113 is a direct current (D.C.) voltage proportional to the voltage controlled oscillator (VCO) frequency, which is proportional to the frequency of $S_{OUT}$. The voltage level of first control signal $C_1(t)$ informs variable delay circuit 107 of the period ($T_O$) of the output signal $S_{OUT}$. The amount of phase adjustments depends on second control signal $C_2(t)$. The amount of time delay per clock cycle ($T_C$) varies as a fraction of the period ($T_O$) of output signal $S_{OUT}$, (e.g., 0<amount of time delay adjustment per clock cycle ($T_C$) <$T_O$), More particularly, at each clock cycle, variable delay circuit 107 adds to the leading edge of reference signal $S_{REF}$ an amount of phase adjustment equal to 360 degrees minus the amount of phase error accumulated after each clock cycle of comparison signal $C_K(t)$ as shown in the following equation:

$$\text{Phase Adjustment per Cycle } T_C = 1 - \text{Accumulated Phase Error}(C_2(t)) \quad (1)$$

$$\text{Delay Adjustment per Cycle} = T_O * (1 - \text{Accumulated Phase Error}(C_2(t))) \quad (2)$$

Continuing with FIG. 2, variable delay circuit 107 is added in the input path 108 of fractional-N phase locked loop circuit 200 to anticipate and remove phase steps in the phase frequency detector 109 of fractional-N phase locked loop 200, thus eliminating mismatch in phase and at the same time avoiding heavy activities of the fractional-N phase locked loop 200. As a result, output signal $S_{OUT}$ will have low jitter.

In one embodiment of the present invention, variable delay circuit 107 includes a plurality of delay elements connected together in series, and the voltage controlled oscillator (VCO) 116 includes a plurality of similar delay elements connected together in a ring formation. The time delay of each delay element is controlled by first control signal $C_1(t)$. The output of each delay element in the variable delay circuit 107 is input to a multiplexer controlled by the second control signal $C_2(t)$. Thus $C_2(t)$ determines number of delay stages used, and thus determines the delay as a fraction of the period of output clock $S_{OUT}$.

Phase frequency detector 109 receives reference signal $S_{REF}$ at input path 108 and a comparison signal $C_K(t)$ from fractional-N frequency divider 201. When comparison signal $C_K(t)$ lags behind reference signal $S_{REF}$, phase frequency detector 109 supplies a positive pulse error signal to charge pump circuit 111. When comparison signal $C_K(t)$ leads reference signal $S_{REF}$, phase frequency detector 109 supplies a negative pulse error signal to charge pump circuit 111. These positive or negative pulse error signal constitutes phase error signal $\phi_e(t)$ at signal path 110.

Charge pump circuit 111 receives phase error signal $\phi_e(t)$ from phase frequency detector 109 via signal path 110 and provides a sequence of pulse error signals $\psi_e(t)$. Each pulse has a pulse width and polarity varying in accordance with phase error signal $\phi_e(t)$. Loop filter 113 receives sequence of error pulse signals $\psi_e(t)$ via signal path 112 and filters out their high frequency components to generate first control signal $C_1(t)$. First control signal $C_1(t)$ is fed back to variable delay circuit 107 via feedback loop 114. First control signal $C_1(t)$ instructs variable delay circuit 107 of the period of output signal $S_{OUT}$.

Referring again to FIG. 2, first control signal $C_1(t)$ is also input to voltage controlled oscillator 116 via signal path 115. Voltage controlled oscillator 116 provides output signal $S_{OUT}$ with output frequency ($f_{OUT}$) proportional to the voltage of first control signal $C_1(t)$. Output signal $S_{OUT}$ of voltage controlled oscillator (VCO) 116 is fed to fractional-N frequency divider 201 via signal path 117.

Continuing with FIG. 2, upon receiving output signal $S_{OUT}$ at signal path 117, fractional-N frequency divider 201 performs average division on frequency for output signal $S_{OUT}$ and provides comparison signal $C_K(t)$ to phase frequency detector 109. Comparison signal $C_K(t)$ has an average frequency ($f_{COM}$) which is the frequency of output signal $S_{OUT}$ divided by non-integer number N' received from non-integer input terminal 103. Comparison signal $C_K(t)$ is fed back to phase frequency detector 109 via signal path 119. More particularly, fractional divider 201 divides frequency ($f_{OUT}$) of output signal $S_{OUT}$ by N (L–K) times and by (N+1) K times. The result is that fractional-N frequency divider 201 achieves non-integer number N' by the following equation:

$$f_{COM} = \frac{f_{OUT}}{\frac{(N \times (L-K)) + ((N+1) \times K))}{L}} = \frac{f_{OUT}}{N + \frac{K}{L}} \quad (3)$$

For example, if $f_{OUT}$ is 100 MHz, N' is 5.2 and L is 10, then N is 5, N+1 is 6, K is 2, and L–K is 8. N/(N+1) frequency divider 118 divides the frequency ($f_{OUT}$) of output signal $S_{OUT}$ by 5 for 80 percent of the time and by 6 for 20 percent of the time as shown in equation 3.

$$f_{COM} = \frac{100 \text{ MHz}}{\frac{(5 \times (8)) + ((6) \times 2))}{10}} = \frac{100 \text{ MHz}}{5.2} \quad (4)$$

Adder 120 receives fraction portion n at fraction terminal 103L. Overflow signal $b_N(t)$ of adder 120 controls the divisor number of N/(N+1) frequency divider 118. The output of adder 120 is a modulo-L addition output $\Sigma_{out}$. Modulo-L addition output $\Sigma_{out}$ is input to register 122. Register 122 is clocked by comparison signal $C_K(t)$ from N/(N+1) frequency divider 118. At every clock cycle $T_C$ of comparison signal $C_K(t)$, register 122 outputs the accumulated phase error. The initial amount of phase error is fraction portion n. The output of register 122 is second control signal $C_2(t)$. Second control signal $C_2(t)$ is also feedback to adder 120 via signal path 123. At every clock cycle $T_C$ of comparison signal $C_K(t)$ the following operations occur:

(a) Previous output 121A of adder 120 is stored in register 122, and presented at variable delay circuit 107, which is second control signal $C_2(t)$;

(b) variable delay circuit 107 adds phase adjustment to the leading edge of divided input $S_{DIVIN}$. The amount of phase adjustment per clock cycle equals to one cycle of output signal $S_{OUT}$ (360 degrees or $2\Pi$ radians) minus amount of phase error contained in second control signal $C_2(t)$, or $1-C_2(t)$;

(c) adder 120 modulo-L adds second control signal $C_2(t)$ to fractional portion n at fraction terminal 103L, producing a sum on output 121A and an overflow on overflow signal $b_N(t)$ 121B.

(d) If overflow signal $b_N(t)$ 121B is high, then N/(N+1) frequency divider 118 divides the output frequency by N+1, else by N.

(e) If overflow signal $b_N(t)$ 121B is high, then this process begins again after N+1 periods of output signal $S_{OUT}$, else it begins again after N periods.

For example, if N'=5.2, K=2 and L is 10. The fraction portion n at fraction terminal 103L is 0.2. At first clock cycle $T_C$ of comparison signal $C_K(t)$, adder 120 adds fraction portion n of 0.2 to the content of register 122 which is 0.0. In the next clock cycle $2*T_C$, second control signal $C_2(t)$ is fed back to adder 120 via signal path 123 and added to the fraction portion (n=0.2). As a result, after second clock cycle, $2*T_C$, output $\Sigma_{out}$ of adder 120 is 0.4. This modulo-L addition process continues until the fifth clock cycle, $5*T_C$ when overflow signal $b_N(t)$ goes HIGH. At the fifth clock cycle, $5*T_C$, N/(N+1) frequency divider 118 divides output frequency ($f_{OUT}$) by N+1 or 6. The adder 120 output $\Sigma_{out}$ will be zero, and the whole process begins again. Thus, second control signal $C_2(t)$ accumulates phase error from 0.2 to 0.8 and then back to 0.0 at the fifth clock cycle $5*T_C$. The amount of phase adjustments $\Delta\phi$ varies from 0.8 cycles ($0.8*T_O$ seconds in time delay) to 0.2 cycles ($0.2*T_O$ seconds in time delay) and back up to one cycle ($T_O$ seconds in time delay). A phase adjustment of one cycle (shifting the signal one whole period $T_O$) added to divided input signal $S_{DIVIN}$ is equivalent to not shifting the input divided signal $S_{DIVIN}$.

Continuing with FIG. 2, in addition to being a modulo-L adder, adder 120 has a noise shaping effect that is capable of removing pattern noise in second control signal $C_2(t)$. In this way, a spurious noise pattern may not be introduced to the output of voltage control oscillator (VCO) 116 due to the averaging of the frequency dividing number over time. Adder 120 adds in a manner such that resulting quantization noise is shaped to high frequencies and thus is filtered out by loop filter 113. In other words, Adder 120 is arranged to displace any quantization noise in comparison signal 119 away from the frequency ($f_{COM}$) of comparison signal $C_K(t)$ and multiples thereof. In effect, the adder 120 is an all pass filter to the substantially constant second control signal $C_2(t)$ and a high pass filter to quantization noise. The noise is shifted away from DC, the frequency of the phase error signal $\phi_e(t)$ and its multiples, thus ameliorating the problem of spurious frequencies and phase noise in output signal $S_{OUT}$.

Theoretically, all noise is removed by a first order sigma delta modulator such as frequency number dividing control circuit 202. However, if there is mismatch in delay 107, there will be some residual noise. A higher order sigma delta modulator can be used to reduce the effect of such noise by pushing it up to a higher frequency.

Figure 3:
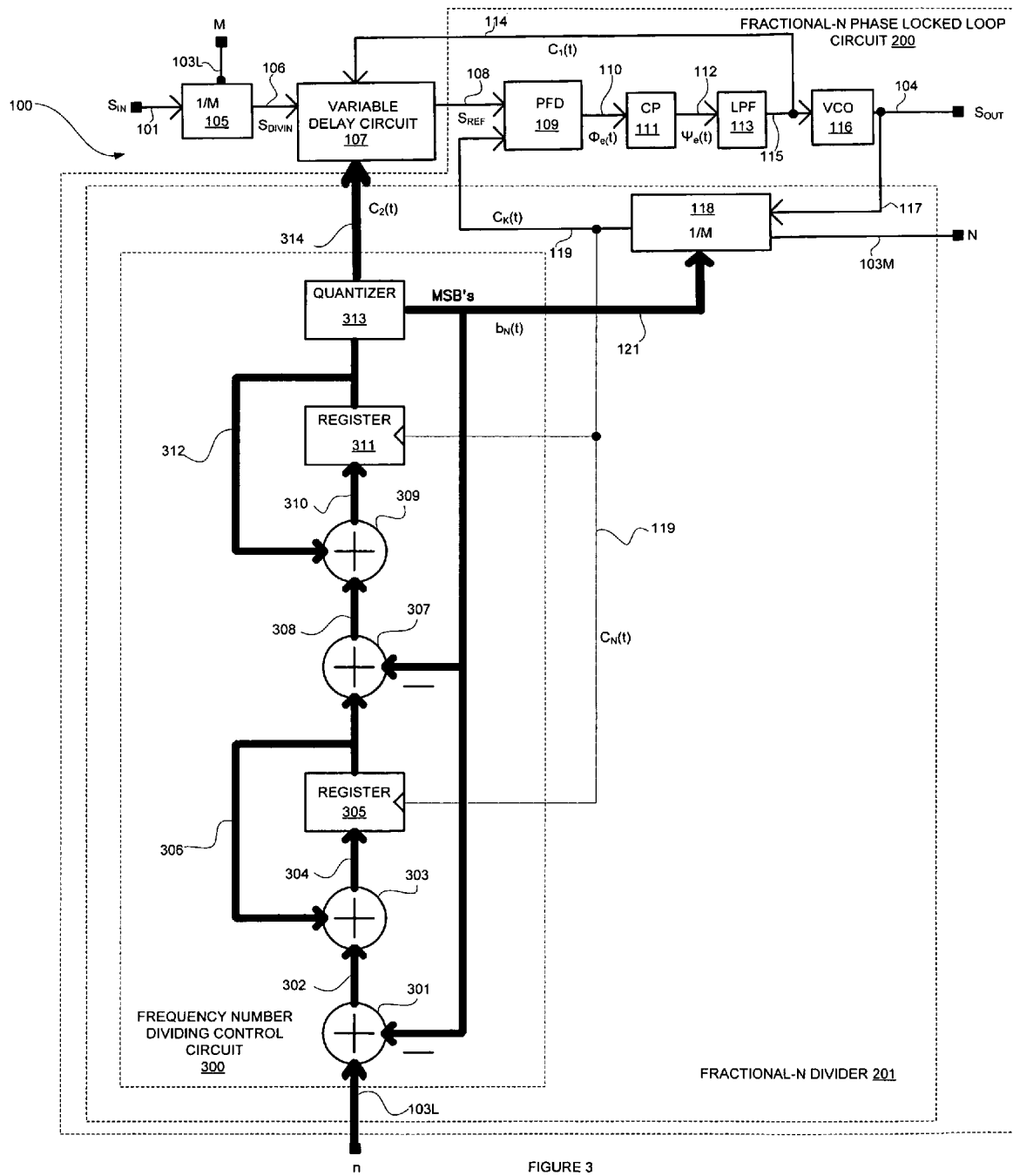
FIG. 3 illustrates a schematic diagram of an embodiment of the phase frequency synthesizer of FIG. 2 that utilizes a higher order sigma delta modulator to provide the phase adjustments to the variable delay circuit in accordance with an embodiment of the present invention.

Now referring to FIG. 3, a block diagram of frequency synthesizer 100 is shown that includes a frequency number dividing control circuit 300. Frequency number dividing control circuit 300 is a higher order sigma delta modulator to provide better phase adjustments to variable delay circuit 107 and that has quantization noise shaping characteristics. In the present embodiment, frequency number dividing control circuit 300 is achieved by cascading adders, subtractors, and registers together. More particularly, frequency number dividing number control circuit 300 includes a plurality of adders and subtractors 301, 303, 307, and 309 cascaded together and to registers 305, 311 and to a quantizer 313 to form a higher order sigma delta modulator. The cascaded architecture described above with one or more feed forwards and feedbacks such as 302, 304, 306, 308, 310 and 312 are used to achieve better stability and randomization characteristics, lower out-of-band noise as well as lower in-band noise. Furthermore, cascading sections of adders 303 and 309, and subtractors 301, and 307 and properly combining their outputs achieves higher order shaping of phase noise, thus further improving the phase noise performance.

Referring again to FIG. 3, in the first stage, subtractor 301 and adder 303 are coupled in series to a first register 305. Subtractor 301 receives fraction portion n at fraction terminal 103L of non-integer number N'. The output of subtractor 301 is electrically coupled to the input of subtractor 303 via forward path 302. The output of adder 303 is fed to register 305 via forward path 304. The output of register 305 is feedback to adder 303.

In the second stage, sigma delta modulators 307 and 309 are coupled in series to a second register 311. Subtractor 307 receives output of first register 305 via forward path 306. The output of subtractor 307 is coupled to the input of adder 309 via forward path 308. The output of adder 309 is fed to register 311 via forward path 310. The output of register 311 is feedback to adder 309 via forward path 312. At the same time, the output of register 311 is coupled to quantizer 313 via forward path 312. The most significant bit (MSB) of quantizer 313 provides overflow signal 121B to N/(N+1) frequency divider 118 and to subtractor 301 and subtractor 307. The least significant bit (LSB) of quantizer 313 provides second control signal $C_2(t)$ to variable delay circuit 107.

In operation, feed forward connections 302, 304, 308, 310 in this embodiment add a zeroes in the low frequency range of the noise transfer function of the higher order sigma delta modulator 300, thereby making it easier to stabilize and to shape the noise.

Figure 4:
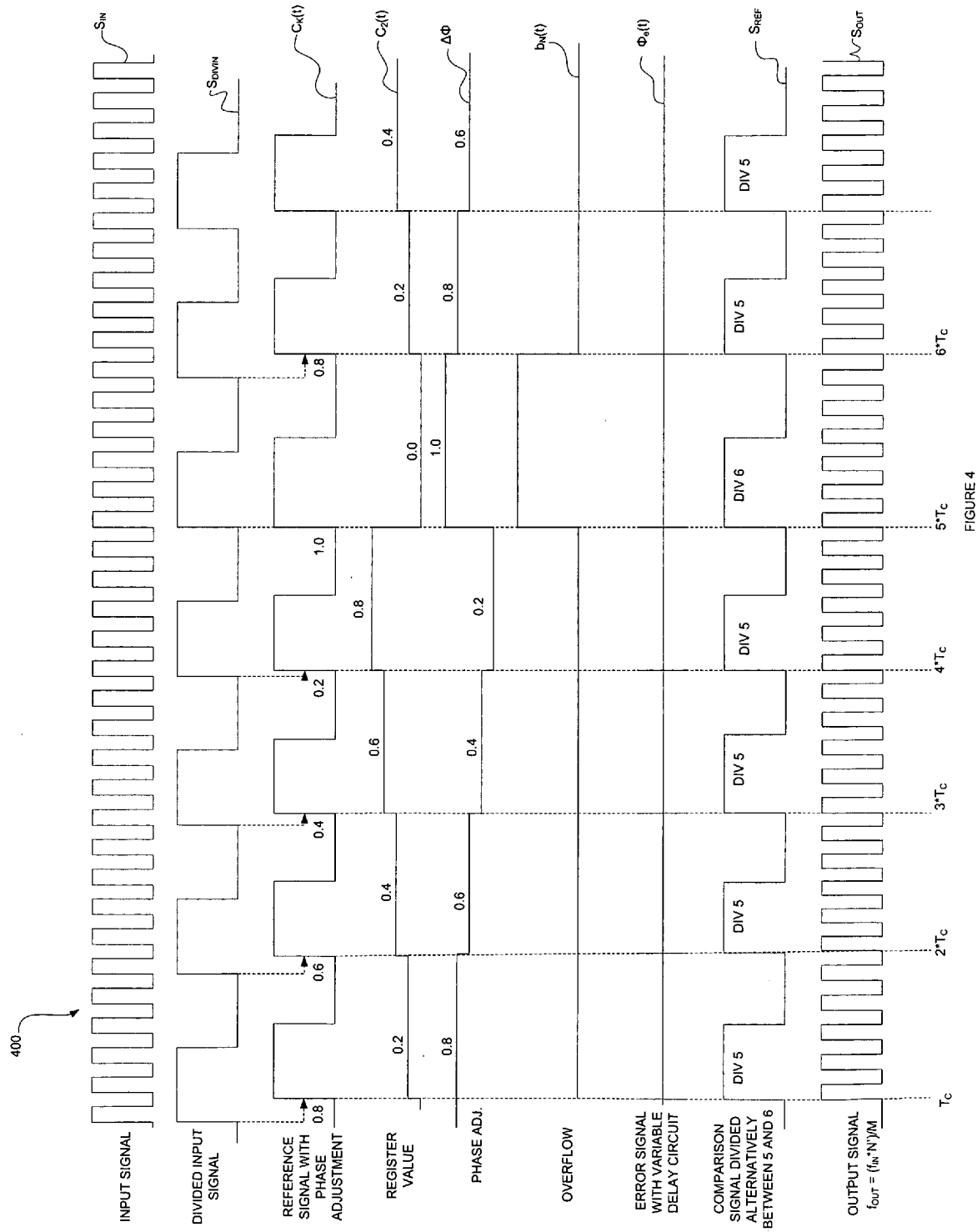
FIG. 4 illustrates exemplary operational waveforms of some of the signals in frequency synthesizer in accordance with an embodiment of the present invention.

Now referring to FIG. 4, a set of operation waveforms 400 illustrates the operation of frequency synthesizer 100. For illustrative purpose, integer number M equal to 5 is input at integer input terminal 102. Non-integer N' equal to 5.2 is input to non-integer input terminal 103. Non-integer number N' can be represented as N'=5+1/5=5+0.2. Thus, fraction portion n is 0.2 and integer portion N is 5. Sigma delta modulator 120 receives fraction portion n=0.2 that indicates the initial phase error at fraction terminal 103L. Set of waveforms 400 includes input signal $S_{IN}$. Input signal $S_{IN}$ is divided by integer number M=5 to yield a waveform $S_{DIVIN}$ representing divided input signal $S_{DIVIN}$. Variable delay circuit 107 provides phase adjustments to $S_{DIVIN}$ to produce waveform $S_{REF}$. The amount of phase adjustments represented by a waveform $\Delta\phi$. Phase frequency detector 109 compared wave form $S_{REF}$ with a waveform $C_K(t)$ representing comparison signal $C_K(t)$. In fractional-N frequency divider 201, a waveform $b_N(t)$ representing overflow signal $b_N(t)$ from adder 120, a waveform $C_2(t)$ representing the content of register 122. The output of phase frequency detector 109 is a waveform $\phi_e(t)$ representing phase error signal $\phi_e(t)$. Waveform $\phi_e(t)$ is a constant zero because variable delay circuit 107 provides phase adjustments to make waveform $S_{REF}$ in phase and in lock with waveform $C_K(t)$. Upon receipt second control signal $C_2(t)$ and first control signal $C_1(t)$, variable delay circuit 107 provides phase adjustments to waveform $S_{DIVIN}$ to produce reference signal $S_{REF}$ represented by a waveform $S_{REF}$. Finally, a waveform $S_{OUT}$ represents output signal $S_{OUT}$ with output frequency $f_{OUT}$ equal to: $f_{OUT}=(f_{IN}*N')/M$. In particular, when M=5 and N'=5.2, $f_{OUT}=(5.2*f_{IN})/5=1.04*f_{IN}$.

Referring to FIG. 4 again, input signal $S_{IN}$ having an input frequency ($f_{IN}$) is received by input frequency divider 105. Input signal $S_{IN}$ is divided by input frequency divider 105 to produce divided input signal $S_{DIVIN}$. Divided input signal $S_{DIVIN}$ is represented by waveform $S_{DIVIN}$. At first when frequency synthesizer 100 is in the free running state, i.e., its feedback loop is not connected to phase frequency detector 109. During the free running state, output signal $S_{OUT}$ has the same frequency as the free running voltage controlled oscillator (VCO) 116, $f_{OUT}=f_{VCO}$. The output of loop filter 113, $C_1(t)$ is a D.C. signal. The D.C. signal of the free running state is usually higher than that of the in-lock state. This is because loop filter 113 receives a D.C. signal from phase frequency detector 109 since the input of phase frequency detector 109 is not connected to fractional-N frequency divider 201. During the free running state, variable delay circuit 107 does not provide phase adjustments to divided input signal $S_{DIVIN}$ because N/(N+1) frequency divider 118 does not clock register 122. As such, register 122 does not output second control signal $C2(t)$ to variable delay circuit 107. In addition, phase frequency detector 109 produces zero error because comparison signal $C_K(t)$ is not connected thereto.

When feedback loop 119 of frequency synthesizer 100 is first connected to phase frequency detector 109, variable delay circuit 107 still does not provide any phase adjustments to divided input signal $S_{DIVIN}$ because second control signal $C_2(t)$ has not clocked out to variable delay circuit 107.

Thus, reference signal $S_{REF}$ is the same as divided input signal $S_{DIVIN}$. At the same time, phase frequency detector 109 quickly detects phase errors $\phi_e(t)$ between reference signal $S_{REF}$ and comparison signal $C_K(t)$. As a result, first control signal $C_1(t)$ is no longer the free running D.C. level. Now, first control signal $C_1(t)$ is a transient signal which has the tendency to settle to a steady state D.C. signal of the lock condition. First control signal now couples the transient output frequency $f_{OUT}$ to variable delay circuit 107.

During the first clock cycle ($T_C$) of comparison signal $C_K(t)$, at the rising edge of comparison signal $C_K(t)$, the initial phase error value n=0.2 is clocked out to variable delay circuit 107 by register 122. During the first cycle ($T_C$), overflow signal $b_N(t)$ is zero and N/(N+1) frequency divider 118 divides output frequency ($f_{OUT}$) by 5. Variable delay circuit 107 receives the output frequency ($f_{OUT}$) from first control signal $C_1(t)$ and amount of initial phase error value n=0.2 from second control signal $C_2(t)$ to calculate phase adjustment $\Delta\phi$, which is 360 degrees (or $2\pi$ radians) minus second control signal $C_2(t)$ (equation 1). Equivalently, the time delay ($\Delta t$) per clock cycle is 0.8 of the output frequency ($f_{OUT}$), or $0.8*T_O$ (seconds) (equation 2). The phase adjustment $\Delta\phi$ for the first clock cycle ($T_C$) is $\Delta\phi$=1-0.2=0.8 cycles. Variable delay circuit 107 shifts the leading edges of divided input signal $S_{DIVIN}$ to the right by an amount equal to $0.8*T_O$ seconds. This is illustrated by waveform $S_{REF}$. Waveform $S_{REF}$ indicates divided input signal $S_{REF}$ after phase adjustments have been added after each cycle. Because reference signal $S_{REF}$ now has the same phase as comparison signal $C_K(t)$, error signal output of phase frequency detector 109 is zero. This is represented by waveform $\phi_e(t)$.

During the second clock cycle ($2*T_C$) of comparison signal $C_K(t)$, at the rising edge of comparison signal $C_K(t)$, the initial phase error value n=0.4 is clocked out to variable delay circuit 107 by register 122. During the second cycle ($2*T_C$), overflow signal $b_N(t)$ is still zero and N/(N+1) frequency divider 118 still divides output frequency ($f_{OUT}$) by 5. Variable delay circuit 107 receives the output frequency ($f_{OUT}$) from first control signal $C_1(t)$ and amount of phase error value n=0.4 from second control signal $C_2(t)$ to calculate phase adjustment $\Delta\phi$, which is 360 degrees (or $2\pi$ radians) minus second control signal $C_2(t)$ (equation 1). Equivalently, the time delay ($\Delta t$) per clock cycle is 0.6 of the output frequency ($f_{OUT}$), or $0.6*T_O$ (seconds) (equation 2). The phase adjustment $\Delta\phi$ for the second clock cycle ($2*T_C$) is $\Delta\phi$=1-0.4=0.6 cycles. Variable delay circuit 107 shifts the leading edges of divided input signal $S_{DIVIN}$ to the right by an amount equal to $0.6*T_O$ seconds. This is illustrated by waveform $S_{REF}$. Waveform $S_{REF}$ indicates divided input signal $S_{REF}$ after phase adjustments have been added after each cycle. Because reference signal $S_{REF}$ now has the same phase as comparison signal $C_K(t)$, error signal output of phase frequency detector 109 is zero. This is represented by waveform $\phi_e(t)$.

At the third clock cycle ($3*T_C$), at the rising edge of comparison signal $C_K(t)$, the initial phase error value n=0.6 is clocked out to variable delay circuit 107 by register 122. During the third clock cycle ($3*T_C$), overflow signal $b_N(t)$ is still zero and N/(N+1) frequency divider 118 still divides output frequency ($f_{OUT}$) by 5. Variable delay circuit 107 receives the output frequency ($f_{OUT}$) from first control signal $C_1(t)$ and amount of phase error value n=0.6 from second control signal $C_2(t)$ to calculate phase adjustment $\Delta\phi$, which is 360 degrees (or $2\pi$ radians) minus second control signal $C_2(t)$ (equation 1). Equivalently, the time delay ($\Delta t$) per clock cycle is 0.4 of the output frequency ($f_{OUT}$), or $0.4*T_O$ (seconds) (equation 2). The phase adjustment $\Delta\phi$ for the third clock cycle ($3*T_C$) is $\Delta\phi$=1-0.6=0.4 cycles. Variable delay circuit 107 shifts the leading edges of divided input signal $S_{DIVIN}$ to the right by an amount equal to $0.4*T_O$ seconds. This is illustrated by waveform $S_{REF}$. Waveform $S_{REF}$ indicates divided input signal $S_{REF}$ after phase adjustments have been added after each cycle. Because reference signal $S_{REF}$ now has the same phase as comparison signal $C_K(t)$, error signal output of phase frequency detector 109 is zero. This is represented by waveform $\phi_e(t)$.

Next, during the fourth clock cycle ($4*T_C$), at the rising edge of comparison signal $C_K(t)$, the initial phase error value n=0.8 is clocked out to variable delay circuit 107 by register 122. During the fourth clock cycle ($4*T_C$), overflow signal $b_N(t)$ is still zero and N/(N+1) frequency divider 118 still divides output frequency ($f_{OUT}$) by 5. Variable delay circuit 107 receives the output frequency ($f_{OUT}$) from first control signal $C_1(t)$ and amount of phase error value n=0.8 from second control signal $C_2(t)$ to calculate phase adjustment $\Delta\phi$, which is 360 degrees (or $2\pi$ radians) minus second control signal $C_2(t)$ (equation 1). Equivalently, the time delay ($\Delta t$) per clock cycle is 0.8 of the output frequency ($f_{OUT}$), or $0.2*T_O$ (seconds) (equation 2). The phase adjustment $\Delta\phi$ for the fourth clock cycle ($4*T_C$) is $\Delta\phi$=1-0.8=0.2 cycles. Variable delay circuit 107 shifts the leading edges of divided input signal $S_{DIVIN}$ to the right by an amount equal to $0.2*T_O$ seconds. This is illustrated by waveform $S_{REF}$. Waveform $S_{REF}$ indicates divided input signal $S_{REF}$ after phase adjustments have been added after each cycle. Because reference signal $S_{REF}$ now has the same phase as comparison signal $C_K(t)$, error signal output of phase frequency detector 109 is zero. This is represented by waveform $\phi_e(t)$.

Continuing with FIG. 4, during the fifth clock cycle ($5*T_C$), at the rising edge of comparison signal $C_K(t)$, the phase error value n=0.0 is clocked out to variable delay circuit 107 by register 122. During the fifth clock cycle ($5*T_C$), due to the nature of modulo-5 of sigma delta modulator 120, overflow signal $b_N(t)$ goes HIGH, represented by waveform $b_N(t)$. As a result, register 122 is zero because the content of sigma delta modulator 120 is cleared out, and issuing logic HIGH to overflow signal $b_N(t)$. As a result, N/(N+1) frequency divider 118 now divides output frequency ($f_{OUT}$) by 6. Variable delay circuit 107 receives the output frequency ($f_{OUT}$) from first control signal $C_1(t)$ and amount of phase error value n=0.0 from second control signal $C_2(t)$ to calculate phase adjustment $\Delta\phi$, which is 360 degrees (or $2\pi$ radians) minus second control signal $C_2(t)$ (equation 1). Equivalently, the time delay ($\Delta t$) per clock cycle is 1.0 of the output frequency ($f_{OUT}$), or $1.0*T_O$ (seconds) (equation 2). The phase adjustment $\Delta\phi$ for the fifth clock cycle ($5*T_C$) is $\Delta\phi$=1-0.0=1.0 cycles. Variable delay circuit 107 shifts the leading edges of divided input signal $S_{DIVIN}$ to the right by the whole period ($T_O$). This is equivalent to not shifting divided input signal waveform $S_{DIVIN}$ at all. Because reference signal $S_{REF}$ now has the same phase as comparison signal $C_K(t)$, error signal output of phase frequency detector 109 is zero. This is represented by waveform $\phi_e(t)$.

After the fifth clock cycle ($6*T_C$), the whole process begins as in the first clock cycle. In the present invention, variable delay circuit 107 anticipates and adjusts the phase shift of divided input signal waveform $S_{DIVIN}$ to produce reference signal waveform $S_{REF}$. Phase adjustments are provided to divided input signal waveform $S_{DIVIN}$ every cycle of comparison signal waveform $C_K(t)$. Fractional-N phase locked loop 200 locks reference signal waveform $S_{REF}$ to comparison signal waveform $C_K(t)$ so as to produce an output signal waveform $S_{OUT}$. When comparison signal waveform $C_K(t)$ is in lock with reference signal waveform $S_{REF}$, they have the same frequency. The frequency ($f_{COM}$) of comparison signal waveform $C_K(t)$ is $f_{COM}=f_{OUT}/N'$ and the frequency of reference signal waveform $S_{REF}$ is $f_{DIVIN}=f_{IN}/M$. Because comparison signal waveform $C_K(t)$ and reference signal waveform $S_{REF}$ are now in lock, $f_{COM}$ equals to $f_{DIVIN}$, or $f_{OUT}/N'=f_{IN}/M$. Equivalently, $f_{OUT}=(N'^*f_{IN})/M$. Because short-term average phase error $\phi_e(t)$ is zero, phase jitter in the output signal $S_{OUT}$ is reduced.

Figure 5:
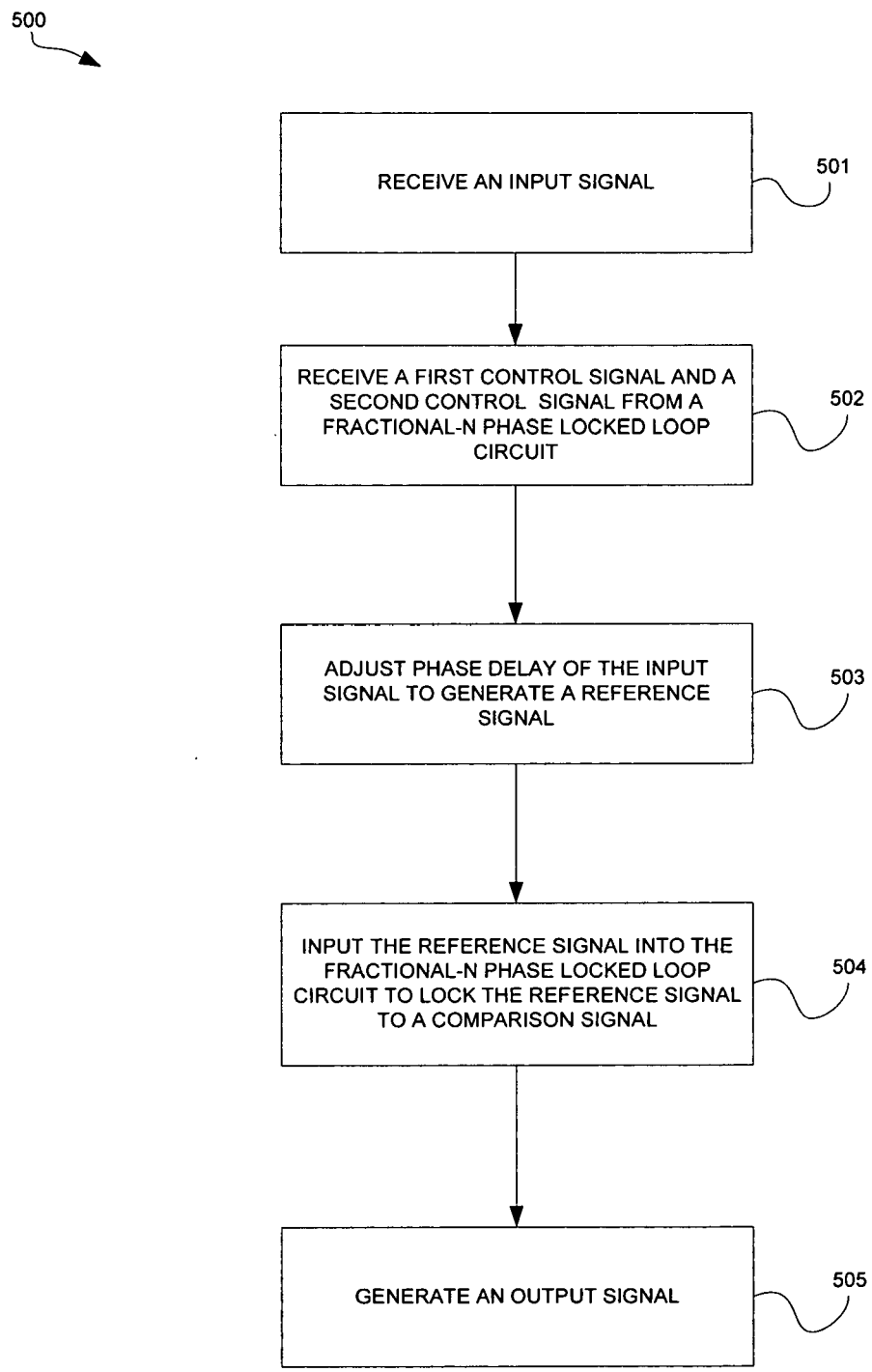
FIG. 5 illustrates a method of achieving a low jitter output signal in accordance with an embodiment of the present invention.

Now referring to FIG. 5, a method 500 for generating an output signal in a fractional-N frequency synthesis is disclosed.

First, as shown by step 501, an input signal $S_{IN}$ having an input frequency ($f_{IN}$) is received. In the present embodiment, input signal is received by input frequency divider 105. Input frequency divided 105 is illustrated in FIG. 2 and FIG. 3. Input frequency divider 105 divides input signal $S_{IN}$ by an integer number M to generate a divided input signal $S_{DIVIN}$ having a divided frequency $f_{DIVIN}$. Integer M is set depending on the frequency resolution that a user wants to achieve. If a user wants to achieve fine frequency resolution, she can set integer M to a high integer number. Contrariwise, a user can set integer M to 1 so that input frequency $f_{IN}$ equals to divided input frequency $f_{DIVIN}$. In the embodiment in which M is set to 1, input frequency divider 105 can be omitted altogether Now referring to step 502, a first control signal and a second control signal from a fractional-N phase locked loop circuit are received. In the present embodiment, first control signal $C_1(t)$ which is received at a variable delay circuit 107. More particularly, first control signal $C_1(t)$ is supplied to variable delay circuit 107 from the output of loop filter 113 via feedback loop 114. Second control signal is provided to variable delay circuit 107 by frequency number dividing control circuit 202.

Now referring to step 503, the phase of input signal $S_{IN}$ is adjusted to generate a reference signal. In the embodiment shown in FIGS. 2-4, the amount of phase adjustment to input signal $S_{IN}$ is determined by fractional-N phase locked loop circuit 200 and is coupled to variable delay circuit 107. The amount of phase adjustment is determined by second control signal $C_2(t)$ and first control signal $C_2(t)$. First control signal provides information about output frequency $f_{OUT}$ and second control signal provides amount of accumulated phase error per cycle. Variable delay circuit 107 uses these information to calculate phase adjustments to divided input signal $S_{DIVIN}$. The amount of phase adjustment is varied depending on accumulated phase error $C_2(t)$ and the output frequency $f_{OUT}$. In other words, phase adjustments and time delay are calculated by variable delay circuit according to the following equations:

Phase Adjustment per Cycle $T_C$=1−Accumulated Phase Error($C_2(t)$) (1)

Time Delay per Cycle=$T_O$*(1−Accumulated Phase Error($C_2(t)$)) (2)

Referring to step 504, the reference signal is input into the fractional-n phase locked loop circuit to lock the reference signal to a comparison signal. In the present embodiment the reference signal is input into fractional-n phase locked loop circuit 200. As shown by step 505, an output signal is generated. The frequency of reference signal is proportional to that of the output signal. In the present embodiment, output signal $S_{OUT}$ is generated by fractional-N phase locked circuit 200. Output signal $S_{OUT}$ has output frequency that is the product of the frequency ($f_{REF}$) reference signal $S_{REF}$ and non-integer number N', $f_{OUT}=N'^*f_{REF}$. The operations by which fractional-N phase locked loop circuit 200 generates output frequency ($f_{OUT}$) based on reference frequency ($f_{REF}$) is illustrated in FIG. 2, FIG. 3, and FIG. 4. The following steps are also performed during step 506 to generate output signal $S_{OUT}$:

(a) previous phase error is shifted out of frequency number dividing control circuit 202 and presented at variable delay circuit 107. This is accumulated phase error that is second control signal $C_2(t)$;

(b) phase error represented by fractional portion n at fraction terminal 103L is modulo-L added to second control signal $C_2(t)$ by sigma delta modulator 120 and is updated in register 122. The modulo-N addition continues until the $(L-K)^{th}$ clock cycle is reached;

(c) variable delay circuit 107 checks the content of first control signal $C_1(t)$ to determine the frequency of output signal $S_{OUT}$; then, variable delay circuit 107 adds phase adjustments to the leading edge of divided input signal $S_{DIVIN}$. The amount of phase adjustment per clock cycle equals to the full cycle ($2\pi$ or 360 degree) of output signal $S_{OUT}$ minus the amount of accumulated phase error contained in second control signal $C_2(t)$;

(d) N/(N+1) frequency divider 118 continues to divide the output frequency by N;

(e) At $K^{th}$ clock cycle, overflow signal $b_N(t)$ becomes HIGH and N/(N+1) frequency divider 118 divides the output frequency ($f_{OUT}$) of output signal $S_{OUT}$ by N+1. At this time, the content of register 122 is cleared out and the whole process begins again;

Variable delay circuit 107 anticipates and adjusts the phase shift of divided input signal waveform $S_{DIVIN}$ to produce reference signal waveform $S_{REF}$. Phase adjustments are provided to divided input signal waveform $S_{DIVIN}$ every cycle of comparison signal waveform $C_K(t)$. Fractional-N phase locked loop 200 locks reference signal waveform $S_{REF}$ to comparison signal waveform $C_K(t)$ so as to produce an output signal waveform $S_{OUT}$. When comparison signal waveform $C_K(t)$ is in lock with reference signal waveform $S_{REF}$, they have the same frequency. The frequency ($f_{COM}$) of comparison signal waveform $C_K(t)$ is $f_{COM}=f_{OUT}/N'$ and the frequency of reference signal waveform $S_{REF}$ is $f_{DIVIN}=f_{IN}/M$. Because comparison signal waveform $C_K(t)$ and reference signal waveform $S_{REF}$ are now in lock, $f_{COM}$ equals to $f_{DIVIN}$, or $f_{OUT}/N'=f_{IN}/M$. Equivalently, $f_{OUT}=(N'^*f_{IN})/M$. Because short-term average phase error $\phi_e(t)$ is zero, phase jitter in the output signal $S_{OUT}$ is reduced.

The present embodiment of the present invention is thus described. While the present invention has been described in particular embodiments, it should be appreciated that the present invention should not be construed as limited by such embodiments, but rather construed according to the following claims.

What is claimed is:

1. A frequency synthesizer for generating an output signal having an output frequency that is a product of an input frequency and a non-integer number, comprising:

a variable delay circuit operable, upon receiving an input signal having said input frequency, a first control signal, and a second control signal, to provide phase adjustments to said input signal so as to generate a reference signal, said phase adjustments varying in dependence on said second control signal and said first control signal;

a fractional-N phase locked loop circuit electrically coupled to said variable delay circuit, said fractional-N phase locked loop circuit operable to receive said reference signal so as to generate said second control signal; and a feedback loop electrically coupled to said fractional-N phase locked loop circuit for supplying said first control signal to said variable delay circuit.

2. The frequency synthesizer of claim 1 further comprising an input frequency divider electrically coupled to said variable delay circuit, said input frequency divider operable upon receiving an integer number and said input signal to produce said input signal having a frequency that is the quotient of said input frequency and said integer number.

3. The frequency synthesizer of claim 1 wherein said second control signal is a result of a modulo-L addition between said second control signal and an initial phase error that is a fraction portion of said non-integer number.

4. The frequency synthesizer of claim 1 wherein said phase adjustments are the product of the cycle of said output signal and said second control signal.

5. The frequency synthesizer of claim 1 wherein said variable delay circuit further comprises a plurality of delay elements electrically coupled together in series configuration, each delay element containing a fraction portion of said non-integer number.

6. The frequency synthesizer of claim 1 wherein said fractional-N phase locked loop circuit, upon receiving said reference signal, is operable to lock said reference signal to a comparison signal having frequency that is a ratio between said output frequency and said non-integer number.

7. The frequency synthesizer of claim 1 wherein said fractional-N phase locked loop circuit further comprises a phase frequency detector electrically coupled to said variable delay circuit, said phase frequency detector operable upon receiving said reference signal and a comparison signal to generate a phase error signal that varies in dependence on the phase difference between said reference signal and said comparison signal.

8. The frequency synthesizer of claim 1 wherein said fractional-N phase locked loop circuit further comprises a charge pump circuit electrically coupled to said variable delay circuit, said charge pump circuit operable to generate a sequence of pulse error signals.

9. The frequency synthesizer of claim 1 wherein said fractional-N phase locked loop further comprises a loop filter electrically coupled to said variable delay circuit, said loop filter operable to filter out high frequency components of said phase error signal so as to generate said first control signal.

10. The frequency synthesizer of claim 1 wherein said fractional-N phase locked loop circuit further comprises a voltage controlled oscillator (VCO) electrically coupled to said variable delay circuit, said voltage controlled oscillator (VCO) operable to produce said output signal, said output signal having said output frequency that is proportional to the voltage of said first control signal.

11. The frequency synthesizer of claim 1 wherein said fractional-N phase locked loop circuit further comprises a fractional-N frequency divider electrically coupled to said variable delay circuit, said fractional-N divider operable to upon receiving said output signal and said non-integer number to generate a comparison signal and said second control signal, said comparison signal having a frequency which is the ratio of said output frequency and said non-integer number.

12. The frequency synthesizer of claim 11 wherein said fractional-N frequency divider further comprises:

an N/(N+1) frequency divider electrically coupled to said variable delay circuit operable upon receiving an overflow signal and said output signal to divide said output frequency alternatively between the integer portion of said non-integer number and the integer portion of said non-integer number incremented by one (N+1), said N/(N+1) frequency divider generating said comparison signal; and a frequency number dividing control circuit electrically coupled to said N/(N+1) frequency divider, said frequency number dividing control circuit operable upon receiving a fraction portion of said non-integer number to generate said second control signal.

13. The frequency synthesizer of claim 12 wherein said frequency number dividing control circuit further comprises:

an adder electrically coupled to said N/(N+1) frequency divider, said adder providing said overflow signal to said N/(N+1) frequency divider; and a register electrically coupled to said variable delay circuit and said adder, said register operable upon receiving an output signal from said adder to provide said second control signal.

14. The frequency synthesizer of claim 12 wherein said frequency number dividing control circuit comprises:

a first adder cascaded to a second adder, said second adder electrically coupled to a first register, the output of said first register being feedback to said second adder;

a third adder cascaded to a fourth sigma adder, said third adder electrically coupled to the output of said first register, said fourth adder electrically coupled to a second register, the output of said first register being feedback to said fourth adder; and a quantizer electrically coupled to said second register, a most significant bit of said quantizer providing said overflow signal to said N/(N+1) frequency divider, a least significant bit of said quantizer providing said second control signal to said variable delay circuit.

15. A frequency synthesizer integrated circuit (IC) having an input terminal, an output terminal, an integer input terminal, and non-integer input terminal, comprising:

an input frequency divider electrically coupled to said input terminal and said integer input terminal, said input frequency divider operable upon receiving an integer number from said integer input terminal and an input signal to produce a divided input signal having a frequency that is equal to the quotient of an input frequency of said input signal and said integer number;

a variable delay circuit electrically coupled to said input frequency divider, said variable delay circuit operable upon receiving said divided input signal to provide phase adjustments to said divided input signal so as to generate a reference signal, said phase adjustments varying in accordance with a second control signal and a first control signal;

a phase frequency detector electrically coupled to said variable delay circuit, said phase frequency detector operable upon receiving said reference signal and a comparison signal to generate a phase error signal that varies in dependence on the phase difference between said reference signal and said comparison signal;

a charge pump circuit electrically coupled to said phase frequency detector, said charge pump circuit operable upon receiving said phase error signal from said phase frequency detector to generate a sequence of pulse error signals whose amplitude and polarity vary in accordance with said phase error signal;

a loop filter electrically coupled to said charge pump circuit, said loop filter operable upon receiving said sequence of pulse error signals from said charge pump circuit to filter high frequency components of said pulse error signal so as to generate said first control signal;

a feedback loop electrically coupled to said variable loop filter for supplying said first control signal to said variable delay circuit;

a voltage controlled oscillator electrically coupled to said loop filter, said voltage controlled oscillator operable upon receiving said first control signal from said loop filter to produce an output signal, said output signal having a frequency that is proportional to the voltage amplitude of said second control signal; and a fractional-N frequency divider electrically coupled to said voltage controlled oscillator and said variable delay circuit, said fractional-N frequency divider operable to upon receiving said output signal and said non-integer number to generate said comparison signal and said second control signal, said comparison signal having a frequency that is the ratio of the frequency of said output signal and said non-integer number.

16. The frequency synthesizer integrated circuit (IC) of claim 15 wherein said fractional-N frequency divider further comprises:

an N/(N+1) frequency divider electrically coupled to said voltage controlled oscillator operable upon receiving an overflow signal and said output signal to divide the frequency of said output signal alternatively between an integer portion of said non-integer number (N) and said integer portion of said non-integer number incremented by one (N+1), said N/(N+1) frequency divider generating said comparison signal; and a frequency number dividing control circuit electrically coupled to said N/(N+1) frequency divider, said frequency number dividing control circuit operable upon receiving a fraction portion of said non-integer number to generate said second control number at each clock cycle of said comparison signal.

17. A method of achieving low jitter output signal in fractional-N frequency synthesis comprising:

receiving an input signal having an associated input frequency;

receiving a control signal and a first feedback signal from a fractional-N phase locked loop circuit;

removing phase error of said input signal by delaying said input signal responsive to said first feedback signal and said control signal to generate a reference signal;

inputting said reference signal into said fractional-N phase locked loop circuit; and performing fractional synthesis on the reference signal with a second feedback signal to generate an output signal having an associated output frequency.

18. The method of claim 17 further comprising receiving an integer number and a non-integer number, wherein the output frequency of the output signal is equal to the product of the input frequency of the input signal and the non-integer number, divided by the integer number.

19. The method of claim 17 wherein said step of performing fractional synthesis on the reference signal with a second feedback signal to generate an output signal having an associated output frequency further comprises:

receiving a non-integer number;

comparing said reference signal to said second feedback signal to generate an error signal;

filtering high frequency components of said error signal to generate said control signal;

using a voltage controlled oscillator to generate the output frequency upon receiving said control signal; and performing fraction-N division of said output frequency to generate said second feedback signal, said second feedback signal having a frequency equal to the frequency of said output signal divided by the non-integer number.

20. The method of claim 17, further comprising the step of receiving a non-integer number and wherein said step of removing the phase error of said input signal further comprises generating said second feedback signal by a modulo-L addition method, said modulo-L addition method having an initial phase error that is equal to a fraction portion of the non-integer number.

21. The method of claim 17 wherein said step of removing the phase error of said input signal further comprises identifying the frequency and the period of said output signal so as to generate a time delay per period of said output signal.

22. A frequency synthesizer, comprising:

variable delay means for providing variable phase adjustments to an input signal so as to generate a reference signal; and phase frequency locking means, electrically coupled to said variable delay means, for locking said reference signal to a second feedback signal so as to generate an output frequency, a control signal, and a first feedback signal, said second feedback signal having a frequency that is a ratio between said output frequency and a non-integer number, said variable delay means for providing variable phase adjustments responsive to said control signal and said first feedback signal.

* * * * *